United States Patent
Liu et al.

(10) Patent No.: US 10,347,683 B2
(45) Date of Patent: Jul. 9, 2019

(54) PHOTO DETECTOR DEVICE

(71) Applicant: InnoLux Corporation, Miao-Li County (TW)

(72) Inventors: Yu-Tsung Liu, Miao-Li County (TW); Te-Yu Lee, Miao-Li County (TW)

(73) Assignee: INNOLUX CORPORATION, Miao-Li County (TW)

(*) Notice: Subject to any disclaimer, the term of this patent is extended or adjusted under 35 U.S.C. 154(b) by 3 days.

(21) Appl. No.: 15/707,423

(22) Filed: Sep. 18, 2017

(65) Prior Publication Data
US 2018/0102393 A1    Apr. 12, 2018

(51) Int. Cl.
*H01L 27/146*    (2006.01)
*H01L 31/105*    (2006.01)
*H01L 31/0376*   (2006.01)

(52) U.S. Cl.
CPC .. *H01L 27/14643* (2013.01); *H01L 27/14636* (2013.01); *H01L 27/14692* (2013.01); *H01L 31/03762* (2013.01); *H01L 31/1055* (2013.01)

(58) Field of Classification Search
CPC ............ H01L 27/14643; H01L 27/14692
USPC ....................................................... 257/458
See application file for complete search history.

(56) References Cited

U.S. PATENT DOCUMENTS

| | | | | |
|---|---|---|---|---|
| 2010/0059804 A1* | 3/2010 | Hayashi | ............ | H01L 27/14603 257/292 |
| 2010/0163882 A1* | 7/2010 | Jung | ................. | H01L 27/14632 257/59 |
| 2011/0266599 A1* | 11/2011 | Ishida | ............... | H01L 27/14658 257/292 |
| 2013/0140568 A1* | 6/2013 | Miyamoto | .......... | H01L 31/0248 257/53 |
| 2014/0231804 A1* | 8/2014 | Yan | ..................... | H01L 27/1214 257/53 |
| 2018/0060641 A1* | 3/2018 | Kim | ................... | G06K 9/00013 |

* cited by examiner

*Primary Examiner* — David Vu
*Assistant Examiner* — Brandon C Fox
(74) *Attorney, Agent, or Firm* — McClure, Qualey & Rodack, LLP

(57) ABSTRACT

A photo detector device is provided. The photo detector device includes a substrate, a first metal layer, a first interlayer dielectric layer, an active layer, a photodiode, and a second metal layer. The first metal layer is disposed on the substrate, wherein the first metal layer includes a gate line and a gate, and the gate is electrically connected to the gate line. The first interlayer dielectric layer is disposed on the first metal layer. The active layer is electrically insulated from the gate and partially overlaps the gate. The photodiode is disposed on the substrate. The second metal layer is disposed on the first interlayer dielectric layer, wherein the second metal layer includes a data line and a bias line, and the bias line is disposed on the photodiode.

9 Claims, 5 Drawing Sheets

US 10,347,683 B2

PHOTO DETECTOR DEVICE

CROSS REFERENCE TO RELATED APPLICATIONS

This Application claims priority of China Patent Application No. 201610889260.8, filed on Oct. 12, 2016, the entirety of which is incorporated by reference herein.

BACKGROUND OF THE INVENTION

Field of the Invention

The disclosure generally relates to photo detector device technology, and more particularly, to a photo detector device which is produced by combining a thin-film transistor (TFT) and a photodiode.

Description of the Related Art

Conventionally, a photo detector device includes an array of pixels. Each pixel of the photo detector device includes a photo sensor element and a readout element. The photo sensor element is used to convert incoming light into an electrical signal. In the conventional manufacturing process of a photo detector device, an amorphous silicon (a-si) transistor or a low-temperature polysilicon (LTPS) is usually combined with the photo diode. Polysilicon has more directional grain structures than amorphous silicon, and the response time of polysilicon is faster. In addition, in contrast to a panel manufactured using a-Si technology, the aperture ratio of the panel manufactured by the LTPS technology is promoted, and therefore, at the same size, the panel manufactured by the LTPS technology may generate higher resolution.

BRIEF SUMMARY OF THE INVENTION

An embodiment of the disclosure provides a photo detector device. The photo detector device includes a substrate, a first metal layer, a first interlayer dielectric layer, an active layer, a photodiode and a second metal layer. The first metal layer is disposed on the substrate, wherein the first metal layer includes a gate line and a gate and the gate is electrically connected to the gate line. The first interlayer dielectric layer is disposed on the first metal layer. The active layer is electrically insulated from the gate and partially overlaps the gate. The photodiode is disposed on the substrate. The second metal layer is disposed on the first interlayer dielectric layer, wherein the second metal layer includes a data line and a bias line, and the bias line is disposed on the photodiode.

Other aspects and features of the disclosure will become apparent to those with ordinary skill in the art upon review of the following descriptions of specific embodiments of the photo detector device.

BRIEF DESCRIPTION OF THE DRAWINGS

The disclosure will become more fully understood by referring to the following detailed description with reference to the accompanying drawings, wherein.

DETAILED DESCRIPTION OF THE INVENTION

The following description is of some modes of carrying out the disclosure. This description is made for the purpose of illustrating the general principles of the disclosure and should not be taken in a limiting sense. The scope of the disclosure is determined by reference to the appended claims.

Figure 1:
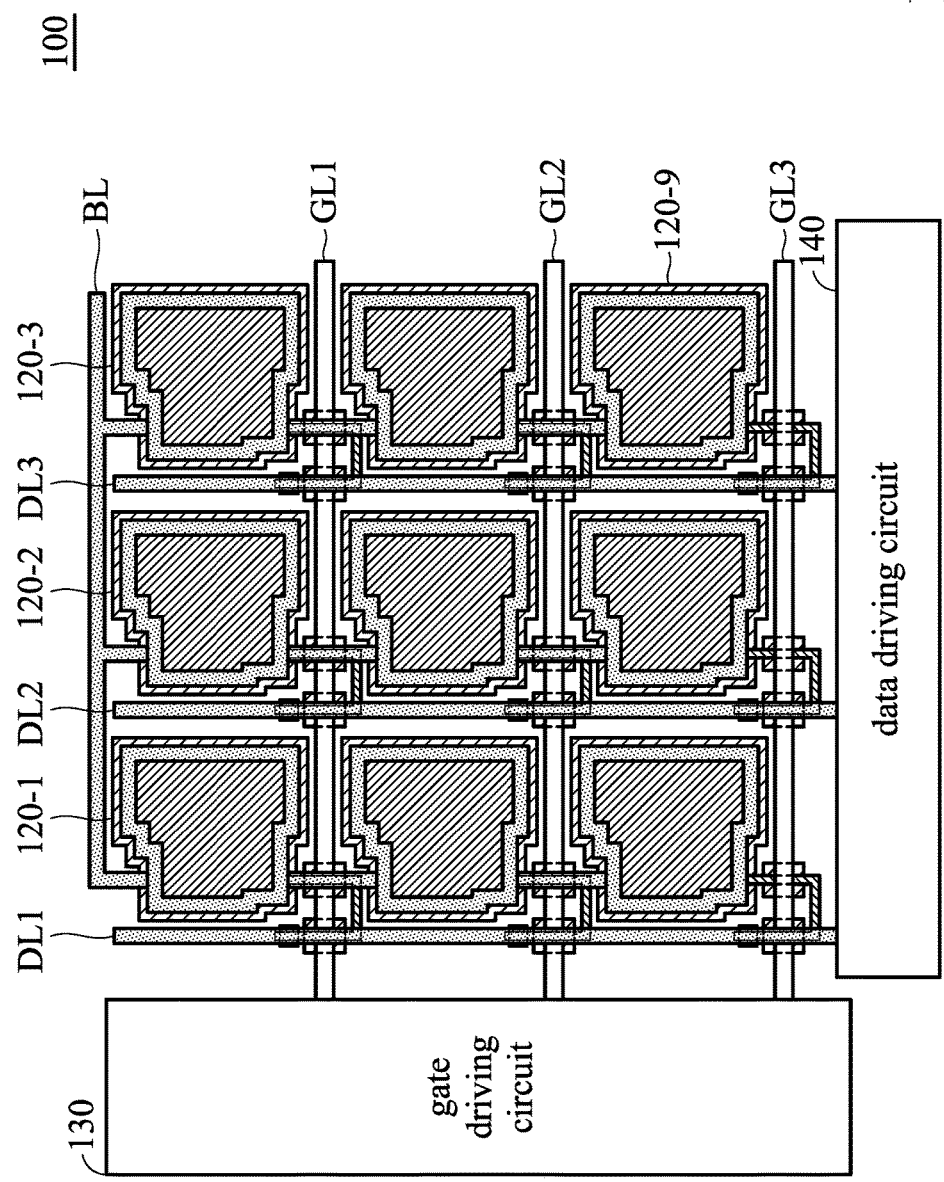
FIG. 1 is a schematic diagram of a photo detector device 100 according to an embodiment of the disclosure.

FIG. 1 is a schematic diagram of a photo detector device 100 according to an embodiment of the disclosure. As shown in FIG. 1, the photo detector device 100 comprises a substrate (not shown in figure), a gate driving circuit 130, a data driving circuit 140, a plurality of gate lines (FIG. 1 presents three gate lines, GL1, GL 2 and GL3), a plurality of data lines (FIG. 1 presents three data lines, DL1, DL2 and DL3) and a bias line BL. The plurality of gate lines and data lines are intersected to define a plurality of pixels. In FIG. 1, pixels 120-1, 120-2 . . . 120-9 are presented. Note that, FIG. 1 only presents a 3*3 pixel array, but the disclosure should not be limited thereto. In addition, in order to clarify the concept of the disclosure, FIG. 1 presents a simplified diagram in which only the elements relevant to the disclosure are shown. However, the disclosure should not be limited to what is shown in FIG. 1.

In an embodiment of the disclosure, the bias line BL is configured to surround each of the pixels 120-1, 120-2 . . . 120-9. In addition, the bias line BL is not connected with the data lines DL1, DL2 and DL3. The gate driving circuit 130 is electrically connected to the gate lines GL1, GL2 and GL3. The data driving circuit 140 is electrically connected to the data lines DL1, DL2 and DL3.

In an embodiment of the disclosure, each of the pixels 120-1, 120-2 . . . 120-9 comprises a photodiode and a TFT switch circuit.

The photodiode is utilized to detect the photo current and is operated in the operation mode of the negative bias (reverse bias voltage). When the intensity of light is greater, the reverse current (i.e. the detected photo current) is higher.

In an embodiment of the disclosure, the TFT switch circuit is electrically connected to the photodiode to control the transmission of the photo current signals of the photodiode. When the TFT switch circuit reads the signals, the TFT switch circuit drives (open) the photodiode to ensure that the photo current signals detected by the photodiode can be read. Details of the structures of the photodiode and TFT switch circuit will be illustrated below.

Figure 2A:
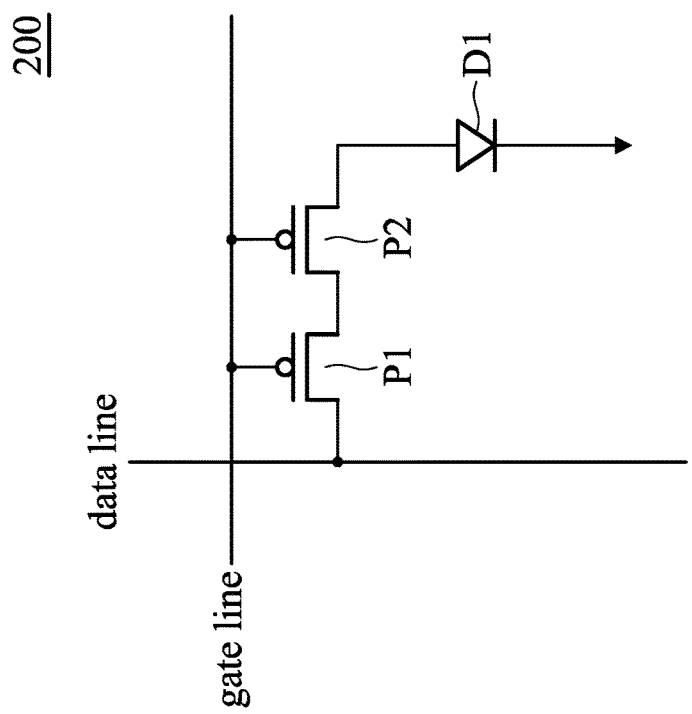
FIG. 2A is a schematic diagram of a pixel 200 according to an embodiment of the disclosure.

FIG. 2A is a schematic diagram of a pixel 200 according to an embodiment of the disclosure. The pixel 200 may be applied to the pixels 120-1, 120-2 . . . 120-9 of the photo detector device 100. As shown in FIG. 2A, the pixel 200 comprises a transistor P1, transistor P2, and a photodiode D1, wherein the transistor P1 and transistor P2 may be regarded as a TFT switch circuit, and the transistor P1 and transistor P2 may be the p-type-LTPS TFT. The gate of the transistor P1 is electrically connected to the gate line of the pixel 200, and two other electrodes (source and drain) of the transistor P1 are electrically connected to the data line of the pixel 200 and the transistor P2 respectively. The gate of the transistor P2 is electrically connected to the gate line of the pixel 200, and the other two electrodes (source and drain) of the transistor P2 are electrically connected to the transistor P1 and the photodiode D1 respectively.

Figure 2B:
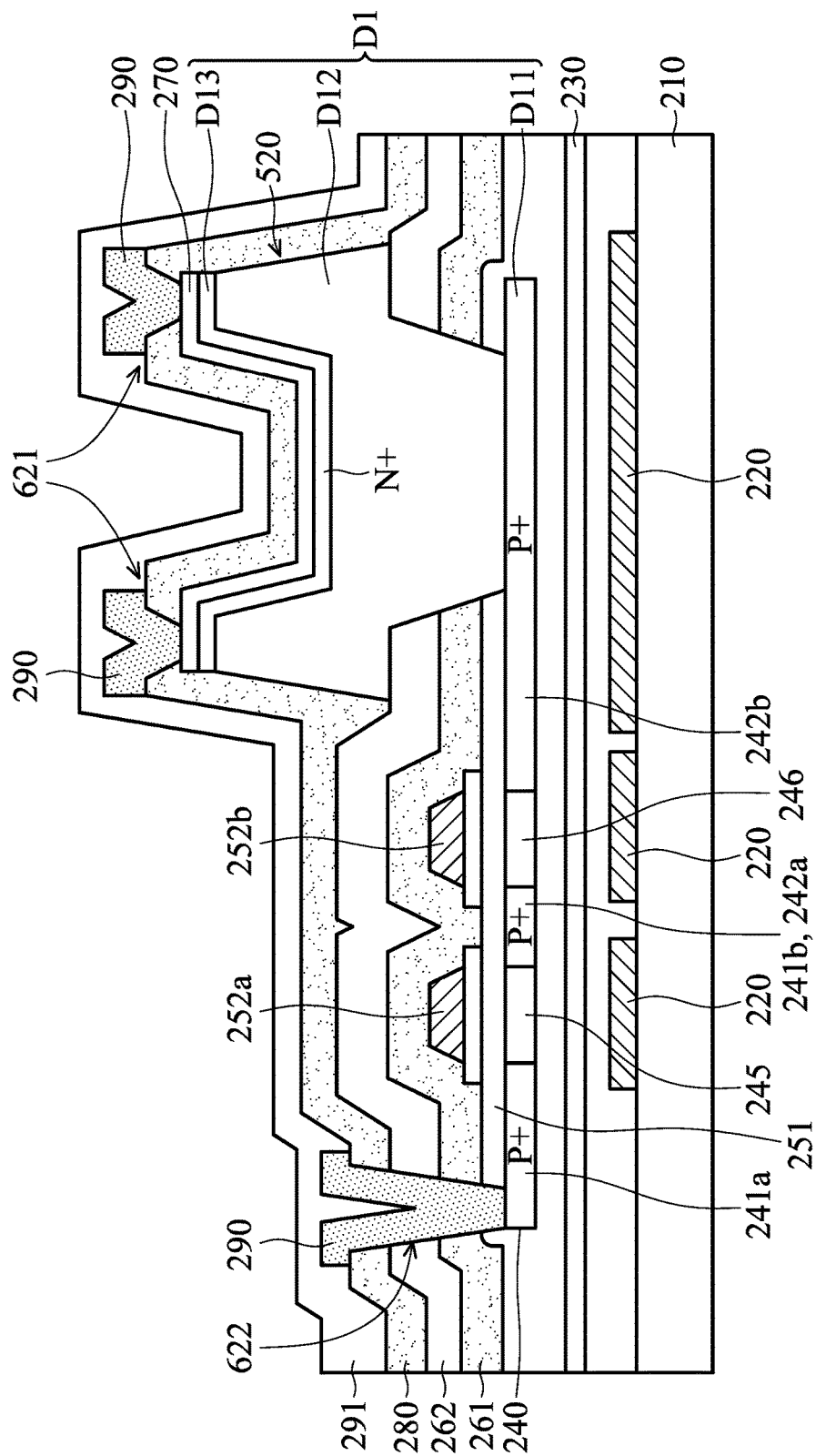
FIG. 2B is a cross-sectional diagram of the pixel 200 according to an embodiment of the disclosure.

FIG. 2B is a cross-sectional diagram of the pixel 200 according to an embodiment of the disclosure. As shown in FIG. 2B, the substrate 210 may be a glass substrate or a plastic substrate, but the disclosure should be not limited thereto. A light-shield layer 220 is formed on the substrate 210. The light-shield layer 220 may avoid light being emitted to the TFT elements (e.g. transistor P1 and transistor P2) when the light is emitted from below.

A buffer layer 230 is formed on the light-shield layer 220. In an embodiment of the disclosure, the buffer layer 230 is a single layer structure or a multi-layer structure (e.g. a SiOx layer, a SiNx layer or a combination of a SiOx layer and a SiNx layer, but the disclosure should be not limited thereto) formed by the chemical vapor deposition (CVD) method or another deposition method. The buffer layer 230 prevents the out-diffusion of the moisture or an impurity which is generated from the substrate 210 to avoid the moisture or impurity affecting the active layer (such as poly-silicon layer) formed in the subsequent procedure.

An active layer 240 is formed on the buffer layer 230. The active layer 240 may be an amorphous silicon (a-Si) layer, poly-silicon layer or metal oxide layer. The metal oxide layer may be indium gallium zinc oxide (IGZO). When the poly-silicon layer is used as the active layer 240 for example, in the process of forming the poly-silicon layer, first, the amorphous silicon layer is formed by the chemical vapor deposition method, such as the plasma enhanced chemical vapor deposition (PEVCD) method. Then, the amorphous silicon layer is irradiated by excimer laser to transform the amorphous silicon layer to the poly-silicon layer 240. After the poly-silicon layer 240 is formed, the poly-silicon layer 240 is subjected to doping to form the source 241a and drain 241b of the transistor P1, the source 242a and drain 242b of the transistor P2, semiconductor channels 245 and 246, and the first semiconductor layer D11 of the photodiode D1. In FIG. 2B, the first semiconductor layer D11 of the photodiode D1 may be a p-type doping layer. In some embodiments of the disclosure, the active layer 240 of the transistor P1 and transistor P2 and the first semiconductor layer D11 of the photodiode D1 may be formed in the same layer at the same time, and therefore, more current may be generated. Therefore, too many bridge connections between the switch circuit and the photo diode can be prevented, and the aperture ratio is not affected. The photodiode D1 comprises three layers. From bottom to top, the three layers are a first semiconductor D11, a second semiconductor D12, and a third semiconductor D13.

Then, a gate insulation layer 251 is formed on the poly-silicon layer 240. The gate insulation layer 251 can be a SiOx layer, a SiNx layer, or a combination of a SiOx layer and a SiNx layer, but the disclosure should be not limited thereto. The gate insulation layer 251 can be a single layer or multiple layers. Then, a first metal layer (not shown in figure) is formed on the gate insulation layer 251 and the first metal layer may be patterned to form the gates 252a of the transistor P1, the gates 252b of the transistor P2 and the gate lines through the lithography process, etching process and other processes. The transistor P1 and the transistor P2 may comprise the sources 241a and 242a, drains 241b and 242b, gate insulation layer 251 and the gates 252a and 252b.

Then, a first interlayer dielectric (ILD) layer 261 and a second interlayer dielectric layer 262 are formed. The first interlayer dielectric layer 261 and the second interlayer dielectric layer 262 can be a SiOx layer, a SiNx layer, or a combination of a SiOx layer and a SiNx layer, but the disclosure should be not limited thereto. The first interlayer dielectric layer 261 and the second interlayer dielectric layer 262 can be a single layer or multiple layers.

Then, an opening 520 is formed in the gate insulation layer 251, first interlayer dielectric layer 261 and the second interlayer dielectric layer 262, and the second semiconductor layer D12 and the third semiconductor D13 of the photodiode D1 is formed on the opening 520. The thickness of the second semiconductor layer D12 can be larger than the first semiconductor layer D11 and the third semiconductor D13. The second semiconductor layer D12 and the third semiconductor D13 may be amorphous silicon layers or poly-silicon layers. The second semiconductor layer D12 may be an intrinsic layer. The third semiconductor D13 and the first semiconductor layer D11 may have different conductivity types. For example, the first semiconductor layer D11 may be a p-type doping layer and the third semiconductor D13 may be an n-type doping layer.

Then, a conductive layer 270 is formed on the third semiconductor D13 of the photodiode D1. The conductive layer 270 can be a transparent conductive layer, for example, an indium tin oxide (ITO) layer. Then, a passivation layer 280 is formed on the conductive layer 270. The passivation layer 280 may be an insulation to isolate both sides of the photodiode D1. Then, a contact hole 621 is formed in the passivation layer 280, and then a second metal layer 290 is formed to fill in the contact hole 621. The second metal layer 290 may comprise a bias line BL. As shown in FIG. 1, the bias line BL may be configured to surround each of the pixels. The second metal layer 290 on the conductive layer 270 may help to collect the light right above the photodiode D1, avoiding light scattering. Thus, light interference from neighboring pixels can be prevented. In addition, a contact hole 622 can be formed in the gate insulation layer 251, first interlayer dielectric layer 261, the second interlayer dielectric layer 262 and the passivation layer 280. The second metal layer 290 can be further filled in the contact hole 622 to form the sources and/or drains of the transistor P1 and the transistor P2. In addition, the second metal layer 290 on the active layer 240 can be patterned to the data line of the pixel 200. In some embodiments of the disclosure, after contact hole 621 and contact hole 622 are formed, the second metal layer 290 may be formed to fill in the contact hole 621 and the contact hole 622 at the same time. Then, a passivation layer 291 is formed on the second metal layer 290 to protect the second metal layer 290.

Figure 3A:
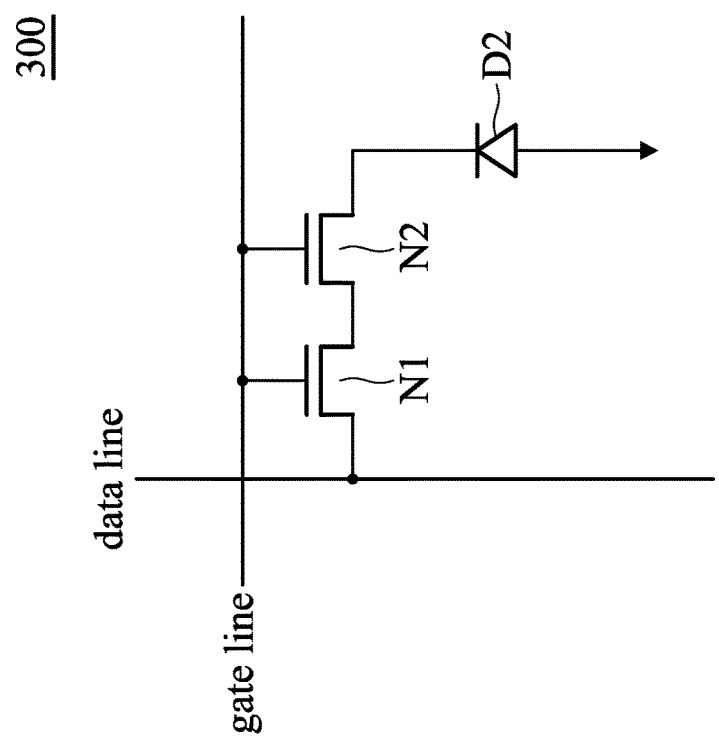
FIG. 3A is a schematic diagram of a pixel 300 according to an embodiment of the disclosure.

FIG. 3A is a schematic diagram of a pixel 300 according to an embodiment of the disclosure. The pixel 300 may be applied to the pixels 120-1, 120-2 . . . 120-9 of the photo detector device 100. As shown in FIG. 3A, the pixel 300 comprises a transistor N1, transistor N2, and a photodiode D2, wherein the transistor N1 and transistor N2 may be regarded as a TFT switch circuit, and the transistor N1 and transistor N2 may be the n-type-LTPS TFT. The gate of the transistor N1 is electrically connected to the gate line of the pixel 300, and the other two electrodes (source and drain) of the transistor N1 are electrically connected to the data line of the pixel 300 and the transistor N2 respectively. The gate of the transistor N2 is electrically connected to the gate line of the pixel 300, and the other two electrodes (source and drain) of the transistor N2 are electrically connected to the transistor N1 and the photodiode D2 respectively.

Figure 3B:
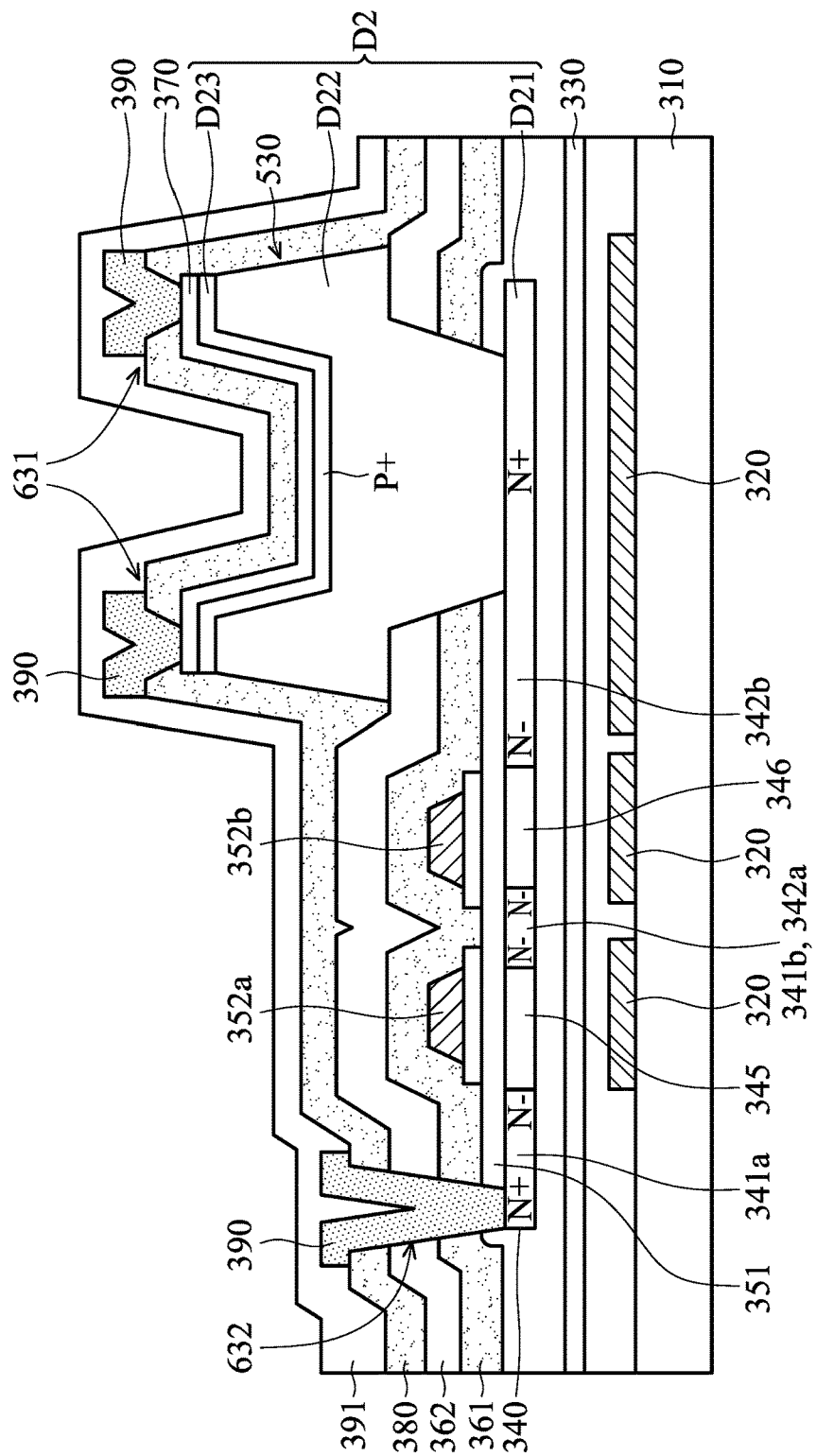
FIG. 3B is a cross-sectional diagram of the pixel 300 according to an embodiment of the disclosure.

FIG. 3B is a cross-sectional diagram of the pixel 300 according to an embodiment of the disclosure. Similar to the processes as illustrated in FIG. 2B, in FIG. 3B, a light-shield layer 320 and the buffer layer 330 are formed on the substrate 310 in order.

An active layer 340 is formed on the buffer layer 330. The active layer 340 may be an amorphous silicon (a-Si) layer, poly-silicon layer or metal oxide layer. The metal oxide layer may be indium gallium zinc oxide (IGZO). When the poly-silicon layer is used as the active layer 240 for example, first, the amorphous silicon layer is formed by the chemical vapor deposition method. Then, the amorphous silicon layer is transformed to the poly-silicon layer 340 (i.e. active layer 340). After the poly-silicon layer 340 is formed, the poly-silicon layer 340 is subjected to doping to form the source 341a and drain 341b of the transistor N1, the source 342a and drain 342b of the transistor N2, semiconductor channels 345 and 346, and the first semiconductor layer D21 of the photodiode D2. In FIG. 3B, the first semiconductor layer D21 of the photodiode D2 may be an n-type doping layer. In some embodiments of the disclosure, the active layer 340 of the transistor N1 and transistor N2 and the second semiconductor layer D21 of the photodiode D2 may be formed in the same layer at the same time, and therefore, more current may be generated. Therefore, too many bridge connections between the switch circuit and the photo diode can be prevented, and the aperture ratio is not affected. The photodiode D2 comprises three layers. From bottom to top, the three layers are a first semiconductor D21, a second semiconductor D22, and a third semiconductor D23.

Then, similar to the processes illustrated in FIG. 2B, a gate insulation layer 351 is formed on the poly-silicon layer 340. Then, a first metal layer (not shown in figure) on the gate insulation layer 351 and the first metal layer may be patterned to form the gates 352a of the transistor N1, the gates 352b of the transistor N2 and the gate lines through a lithography process, an etching process, and other processes. The transistor N1 and the transistor N2 may comprise the sources 341a and 342a, drains 341b and 342b, gate insulation layer 351 and the gates 352a and 352b.

Then, a first interlayer dielectric (ILD) layer 361 and a second interlayer dielectric layer 362 are formed. Then, an opening 530 is formed in the gate insulation layer 351, first interlayer dielectric layer 361 and the second interlayer dielectric layer 362, and the second semiconductor layer D22 and the third semiconductor D23 of the photodiode D2 is formed on the opening 530. The thickness of the second semiconductor layer D22 can be larger than the first semiconductor layer D21 and the third semiconductor D23. The second semiconductor layer D22 and the third semiconductor D23 may be amorphous silicon layers or poly-silicon layers. The second semiconductor layer D22 may be an intrinsic layer. The third semiconductor D23 and the first semiconductor layer D21 may have different conductivity types. For example, the first semiconductor layer D21 may be an n-type doping layer and the third semiconductor D23 may be a p-type doping layer.

Then, a conductive layer 370 is formed on the third semiconductor D23 of the photodiode D2. The conductive layer 370 can be a transparent conductive layer, for example, an indium tin oxide (ITO) layer. Then, a passivation layer 380 is formed on the conductive layer 370. The passivation layer 380 may be an insulation utilized to isolate the both sides of the photodiode D2. Then, a contact hole 631 is formed in the passivation layer 380 which is on the top of the conductive layer 370 and a second metal layer 390 is formed to fill in the contact hole 631. The second metal layer 390 may comprise a bias line BL. As shown in FIG. 1, the bias line BL may be configured to surround each of the pixels.

The second metal layer 390 on the top of the conductive layer 370 may help to collect the light right above the photodiode D2, avoiding light scattering. Thus, light interference from neighboring pixels can be prevented. In addition, a contact hole 632 can be formed in the gate insulation layer 351, first interlayer dielectric layer 361, the second interlayer dielectric layer 362 and the passivation layer 380. The second metal layer 390 can be further filled in the contact hole 632 to form the electrodes of the sources and/or drains of the transistor N1 and the transistor N2. In addition, the second metal layer 390 on the active layer 340 can be patterned to the data line of the pixel 300. In some embodiments of the disclosure, after contact hole 631 and contact hole 632 are formed, the second metal layer 390 may be formed to fill in the contact hole 631 and the contact hole 632 at the same time. Then, a passivation layer 391 is formed on the second metal layer 390 to protect the second metal layer 390.

In the embodiments of the disclosure, the photo detector device 100 may be applied to fingerprint recognition, x-ray image sensing technology, and so on. Therefore, the photo detector device 100 may be a fingerprint recognition device or an x-ray image sensing device.

In some embodiments of the disclosure, the bias line which surrounds the pixels is configured on the conductive layer of the photodiode to reduce resistance or avoid interference from neighboring pixels. In addition, the bias line and the second metal layer of the transistor are configured in the same layer to simplify the manufacturing processes.

Reference throughout this specification to "one embodiment" or "an embodiment" means that a particular feature, structure, or characteristic described in connection with the embodiment is included in at least one embodiment of the disclosure, but do not denote that they are present in every embodiment. Thus, the appearances of the phrases "in one embodiment" or "in an embodiment" in various places throughout this specification are not necessarily referring to the same embodiment of the disclosure The above paragraphs describe many aspects. Obviously, the teaching of the disclosure can be accomplished by many methods, and any specific configurations or functions in the disclosed embodiments only present a representative condition. Those who are skilled in this technology will understand that all of the disclosed aspects in the disclosure can be applied independently or be incorporated.

While the disclosure has been described by way of example and in terms of embodiment, it is to be understood that the disclosure is not limited thereto. Those who are skilled in this technology can still make various alterations and modifications without departing from the scope and spirit of this disclosure. Therefore, the scope of the present disclosure shall be defined and protected by the following claims and their equivalents.

What is claimed is:

1. A photo detector device, comprising:
   a substrate;
   a first metal layer, disposed on the substrate, wherein the first metal layer comprises a gate line and a gate, and the gate is electrically connected to the gate line;
   a first interlayer dielectric layer, disposed on the first metal layer;
   a photodiode, disposed on the substrate;
   an active layer, electrically insulated from the gate and partially overlapping the photodiode;
   and
   a second metal layer, disposed on the first interlayer dielectric layer, wherein the second metal layer comprises a data line and a bias line, and the bias line is disposed on the photodiode, wherein the first metal layer comprises a plurality of gate lines, the second metal layer comprises a plurality of data lines and a plurality of bias lines, the gate lines and the data lines are intersected to define a plurality of pixels, wherein the pixels comprise a first pixel, and the bias lines comprise a first bias line surrounding the first pixel.

2. The photo detector device of claim 1, wherein the photodiode comprises a photoelectric layer and a conductive layer, and the conductive layer is disposed between the photoelectric layer and the bias line.

3. The photo detector device of claim 2, wherein the bias line is electrically connected to the conductive layer.

4. The photo detector device of claim 3, further comprising:
 a passivation layer, disposed on the conductive layer, wherein a contact hole is formed in the passivation layer, and the bias line is filled in the contact hole to electrically connect to the conductive layer.

5. The photo detector device of claim 1, wherein the pixels comprise a second pixel, and the bias lines comprise a second bias line surrounding the second pixel, and wherein the first bias line and the second bias line are electrically connected each other.

6. The photo detector device of claim 1, wherein the data line is not connected with the bias line.

7. The photo detector device of claim 2, wherein the photoelectric layer comprises a first doping layer, an intrinsic layer and a second doping layer, the intrinsic layer is disposed between the first doping layer and the second doping layer, and the active layer comprises the first doping layer.

8. The photo detector device of claim 1, wherein the photo detector device is a fingerprint recognition device.

9. The photo detector device of claim 1, wherein the photo detector device is an X-ray image sensing device.

* * * * *